(12) United States Patent
Wadell et al.

(10) Patent No.: US 10,972,192 B2
(45) Date of Patent: Apr. 6, 2021

(54) HANDLER CHANGE KIT FOR A TEST SYSTEM

(71) Applicant: Teradyne, Inc., North Reading, MA (US)

(72) Inventors: Brian Charles Wadell, Reading, MA (US); Jonathan Hanes Williams, Andover, MA (US); Roger Allen Sinsheimer, Camarillo, CA (US)

(73) Assignee: TERADYNE, INC., North Reading, MA (US)

(*) Notice: Subject to any disclaimer, the term of this patent is extended or adjusted under 35 U.S.C. 154(b) by 39 days.

(21) Appl. No.: 15/977,871

(22) Filed: May 11, 2018

(65) Prior Publication Data

US 2019/0349096 A1 Nov. 14, 2019

(51) Int. Cl.
| | |
|---|---|
| *H04B 17/00* | (2015.01) |
| *H04B 17/10* | (2015.01) |
| *G01R 31/01* | (2020.01) |
| *G01R 1/18* | (2006.01) |
| *G01R 31/28* | (2006.01) |

(52) U.S. Cl.
CPC ....... *H04B 17/102* (2015.01); *G01R 31/2862* (2013.01); *G01R 31/2863* (2013.01); *G01R 31/2893* (2013.01); *H04B 17/0085* (2013.01)

(58) Field of Classification Search
CPC .............. H04B 17/102; H04B 17/0085; G01R 31/2862; G01R 31/2863; G01R 31/2893; G01R 1/04; G01R 31/28; G01R 31/319; G01R 31/04; G01R 31/303; G01R 1/24
See application file for complete search history.

(56) References Cited

U.S. PATENT DOCUMENTS

| | | | |
|---|---|---|---|
| 4,864,077 A | 9/1989 | Wadell | |
| 4,894,753 A | 1/1990 | Wadell | |
| 5,312,262 A * | 5/1994 | Bublitz | ............... H01R 13/633 |
| | | | 439/160 |
| 5,471,148 A | 11/1995 | Sinsheimer et al. | |
| 5,528,158 A | 6/1996 | Sinsheimer et al. | |
| 5,572,160 A | 11/1996 | Wadell | |
| 6,027,346 A | 2/2000 | Sinsheimer et al. | |
| 6,066,953 A | 5/2000 | Wadell | |
| 6,107,813 A | 8/2000 | Sinsheimer et al. | |
| 6,166,553 A | 12/2000 | Sinsheimer | |
| 6,204,813 B1 | 3/2001 | Wadell et al. | |

(Continued)

FOREIGN PATENT DOCUMENTS

| | | | | |
|---|---|---|---|---|
| JP | 10142291 A | * | 5/1998 | ............. G01R 31/01 |
| JP | 10142291 A | | 5/1998 | |

OTHER PUBLICATIONS

Campion, D., Contacting Challenges for 5G, BiTs 2018 Poster Session, 3 pages (Mar. 4-7, 2018).

(Continued)

*Primary Examiner* — Pablo N Tran
(74) *Attorney, Agent, or Firm* — Burns & Levinson LLP

(57) ABSTRACT

An example system includes a receptacle to house a device under test (DUT); an antenna for exchanging signals with the DUT, where at least some of the signals are for use in performing radiated testing of the DUT; and a cap configured to mate to the receptacle to form a housing to enclose the DUT. The housing is for isolating the DUT at least one of physically or electromagnetically.

35 Claims, 9 Drawing Sheets

(56) References Cited

U.S. PATENT DOCUMENTS

| | | | |
|---|---|---|---|
| 6,833,696 B2 | 12/2004 | Sinsheimer et al. | |
| 6,888,427 B2 | 5/2005 | Sinsheimer et al. | |
| 6,963,211 B2 | 11/2005 | Sinsheimer et al. | |
| 7,078,890 B2 | 7/2006 | Sinsheimer et al. | |
| 7,242,209 B2* | 7/2007 | Roberts | G01R 31/319 |
| | | | 324/756.02 |
| 7,295,024 B2 | 11/2007 | Sinsheimer | |
| 7,358,754 B2 | 4/2008 | Sinsheimer et al. | |
| 8,811,461 B1* | 8/2014 | Huynh | H04B 17/0085 |
| | | | 375/224 |
| 8,917,761 B2 | 12/2014 | Huynh | |
| 9,435,855 B2 | 9/2016 | Lewinnek et al. | |
| 9,594,114 B2 | 3/2017 | Sinsheimer | |
| 9,755,766 B2 | 9/2017 | Wadell et al. | |
| 9,786,977 B2 | 10/2017 | Lyons et al. | |
| 9,800,355 B1* | 10/2017 | Lee | H04B 17/17 |
| 9,838,076 B2* | 12/2017 | Lam | H04B 3/46 |
| 9,985,733 B1* | 5/2018 | Lee | H04B 17/29 |
| 10,060,475 B2 | 8/2018 | Sinsheimer et al. | |
| 10,088,521 B2* | 10/2018 | Yun | G01R 1/0433 |
| 10,274,515 B1* | 4/2019 | Sherry | G01R 1/045 |
| 10,345,418 B2 | 7/2019 | Wadell et al. | |
| 10,389,455 B2* | 8/2019 | Elfstrom | H04B 17/101 |
| 10,451,652 B2 | 10/2019 | Sinsheimer et al. | |
| 10,520,534 B1* | 12/2019 | Rowell | G01R 29/0871 |
| 2004/0135656 A1 | 7/2004 | Sinsheimer et al. | |
| 2004/0174174 A1 | 9/2004 | Sinsheimer et al. | |
| 2005/0046411 A1 | 3/2005 | Sinsheimer et al. | |
| 2005/0264311 A1 | 12/2005 | Sinsheimer et al. | |
| 2006/0183377 A1 | 8/2006 | Sinsheimer | |
| 2006/0244471 A1 | 11/2006 | Sinsheimer | |
| 2007/0126439 A1 | 6/2007 | Sinsheimer et al. | |
| 2007/0176615 A1 | 8/2007 | Sinsheimer | |
| 2008/0025012 A1 | 1/2008 | Sinsheimer | |
| 2008/0030211 A1 | 2/2008 | Sinsheimer | |
| 2008/0030212 A1 | 2/2008 | Sinsheimer | |
| 2008/0030213 A1 | 2/2008 | Sinsheimer | |
| 2009/0051366 A1* | 2/2009 | Miyauchi | G01R 31/2822 |
| | | | 324/537 |
| 2009/0184719 A1 | 7/2009 | Ko et al. | |
| 2012/0152309 A1 | 6/2012 | Miller et al. | |
| 2013/0002280 A1* | 1/2013 | Nickel | G01R 31/2891 |
| | | | 324/750.16 |
| 2015/0085903 A1* | 3/2015 | Gundel | H05K 1/0239 |
| | | | 375/219 |
| 2015/0137848 A1 | 5/2015 | Lewinnek et al. | |
| 2015/0168486 A1* | 6/2015 | Isaac | G01R 1/045 |
| | | | 324/756.02 |
| 2015/0377946 A1 | 12/2015 | Sinsheimer | |
| 2016/0018442 A1 | 1/2016 | Sinsheimer et al. | |
| 2016/0109512 A1 | 4/2016 | Kim et al. | |
| 2016/0131702 A1 | 5/2016 | Sinsheimer | |
| 2016/0186804 A1 | 6/2016 | Sinsheimer et al. | |
| 2017/0102409 A1* | 4/2017 | Sarhad | G01R 1/045 |
| 2017/0146632 A1 | 5/2017 | Wadell et al. | |
| 2017/0163358 A1 | 6/2017 | Wadell et al. | |
| 2017/0170537 A1 | 6/2017 | Lyons et al. | |
| 2019/0187200 A1 | 6/2019 | Gondi | G01R 29/10 |
| 2019/0349096 A1 | 11/2019 | Wadell et al. | |
| 2020/0025822 A1* | 1/2020 | Rowell | G01R 31/2874 |

OTHER PUBLICATIONS

International Search Report for PCT/US2019/028249, 3 pages (dated Aug. 5, 2019).

Written Opinion for PCT/US2019/028249, 8 pages (dated Aug. 5, 2019).

International Preliminary Report on Patentability for International Application No. PCT/US2019/028249, dated Nov. 26, 2020, (9 pages).

* cited by examiner

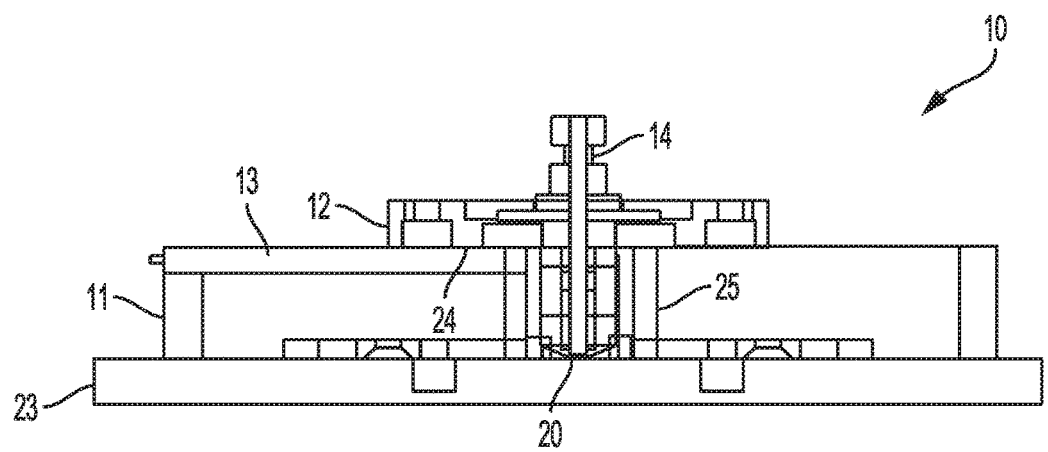
FIG. 1A
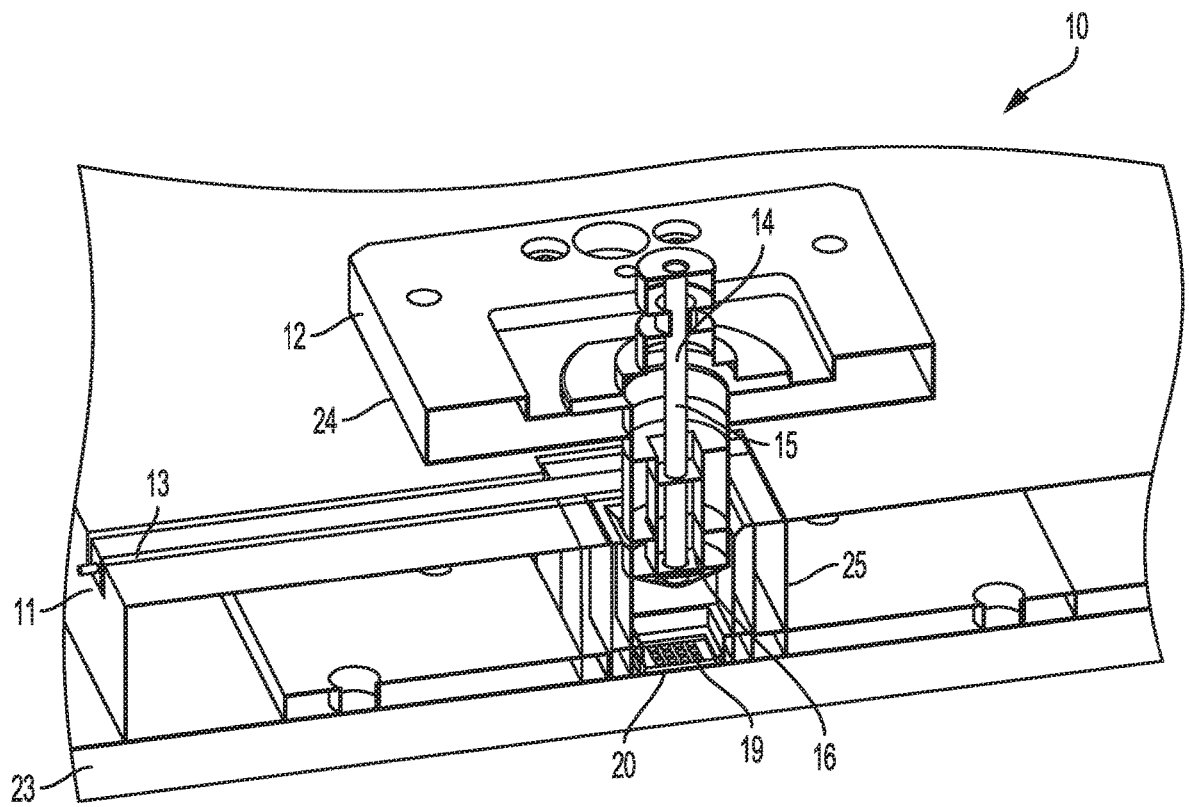
FIG. 1B
| FIG. 1A |
| FIG. 1B |
FIG. 1

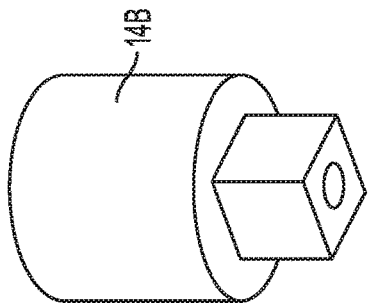
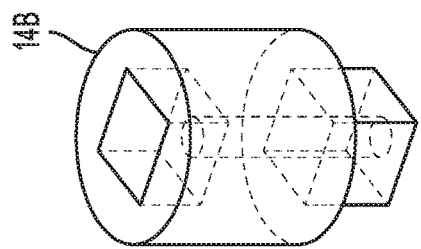
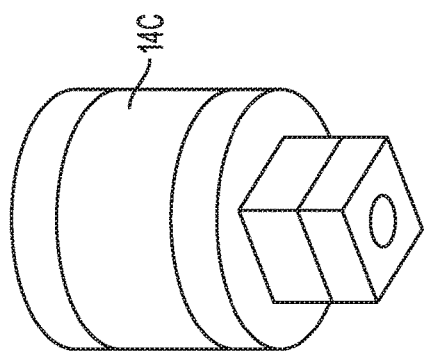
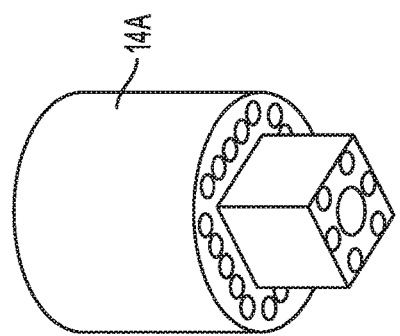
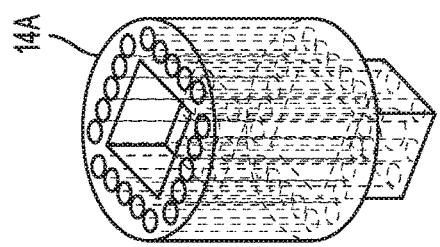
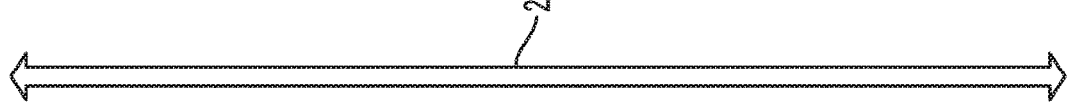
FIG. 3A  FIG. 3B  FIG. 3C

HANDLER CHANGE KIT FOR A TEST SYSTEM

TECHNICAL FIELD

This specification relates generally to a handler change kit for a test system, such as automatic test equipment (ATE).

BACKGROUND

Test systems, such as ATE, may be configured to perform conductive tests on electronic devices, such as computer chips. In an example, a device interface board (DIB) includes customer-specific hardware that interfaces to the test system. The DIB may include multiple sockets, each of which may hold a separate electronic device and enable the test system to send signals to, and to receive signals from, the electronic device. The signals may be used to test operation of the electronic device and for other appropriate purposes. Testing in this manner may be referred to as conductive testing because the connections made between the electronic device and the DIB are conductive connections—for example, the connections may be metal-to-metal, which enable signals to flow, via the DIB, between the test system and the electronic device.

In contrast to conductive testing, radiated testing involves performing testing using signals that are transmitted wirelessly. For example, radiated testing may be used to test the operation of radio frequency (RF) antennas, microwave antennas, or other types of antennas on electronic devices. Radiated testing may also be used to test, as appropriate, components of electronic devices other than antennas.

SUMMARY

An example system includes a receptacle to house a device under test (DUT); an antenna for exchanging signals with the DUT, where at least some of the signals are for use in performing radiated testing of the DUT; and a cap configured to mate to the receptacle to form a housing to enclose the DUT. The housing is for isolating the DUT at least one of physically or electromagnetically. The example system may include one or more of the following features, either alone or in combination.

The system may be configured to connect to a device interface board (DIB) of a test system. The DIB may comprise a socket to receive the DUT. The DIB may comprise one or more other sockets to receive one or more other DUTs. The housing may be for isolating the DUT from the one or more other DUTs. The DIB may comprise a legacy DIB that is also configurable for use absent the housing and outside a context of radiated testing. The housing may be for isolating the DUT both physically and electromagnetically from one or more of the following: other DUTs, dielectric materials, metallic materials, magnetic materials, or electromagnetic signals.

The cap may comprise a plunger that is movable within the receptacle to apply pressure to the DUT to cause the DUT to connect to a test socket. The system may be configured to connect to a test system comprising a socket to receive the DUT. The antenna may be arranged to a side of the socket. The antenna may comprise multiple antennas. Each of the multiple antennas may be arranged to a side of the socket. The antenna may be arranged underneath at least one of the DUT or the DIB. The socket may be part of the DIB. The antenna may be underneath the DUT. The antenna may be underneath the DIB. The antenna may be part of the DIB.

The DUT may have a surface comprising electrical connections. The cap may comprise a plunger configured to hold the DUT by the surface containing the electrical connections and to mount the DUT such that the electrical connections face away from the socket. The system may comprise one or more electrical conduits to connect to the electrical connections. The system may be configured to connect to a test system comprising a socket to receive the DUT.

The cap may comprise a plunger to contact the DUT. The antenna may be arranged within the plunger. The plunger may be directly above the socket, and may be configured to move within the receptacle relative to the socket. The plunger may be comprised of a material having one or more of electrical properties. The one or more electrical properties may comprise ranges of dielectric permittivity, permeability, or conductivity. The material may comprise, at least in part, polyether ether ketone (PEEK). The plunger may have multiple holes along at least part of a longitudinal dimension of the plunger. The plunger may have a single hole along at least part of a longitudinal dimension of the plunger. The plunger may be hollow along at least part of a longitudinal dimension of the plunger. The plunger may comprise a vacuum channel for holding the DUT via suction during transport to the receptacle.

An interior of the housing may be lined, at least in part, with a material for suppressing echoes. The housing may be configured to house the DUT and at least one other DUT. The DUT may be isolated electromagnetically from the at least one other DUT through signals having different frequency bands. Signals exchanged with the DUT may be in a first frequency band, signals exchanged with the at least one other DUT may be in at least one second frequency band, and the first frequency band may be different from the at least one second frequency band.

The system may be part of a handler change kit configured to connect to a DIB of a test system. The DIB may comprise test sockets configured for performing non-radiated testing. The handler change kit may be for adapting at least one of the test sockets to perform radiated testing on the DUT.

An example system comprises a DIB for interfacing to a test system, where the DIB comprises sockets, each of which is for receiving a DUT. The example system also includes receptacles, each of which is for a different one of the sockets; and antennas, each of which is associated with a different one of the sockets. Each antenna is for exchanging signals with a DUT in a socket. At least some of the signals are for use in performing radiated testing of the DUT in the socket. The example system includes a cap configured to mate to the receptacles to form a separate housing for, and enclosing, each one of the DUTs. Each separate housing isolates a DUT enclosed in the housing at least one of physically or electromagnetically. The example system may include one or more of the following features, either alone or in combination.

The cap may comprise one or more plungers, each of which is for holding, and contacting, a DUT in a separate socket. For a housing among the separate housings, an antenna among the antennas may be located to a side of a socket on the DIB. For a housing among the separate housings, an antenna among the antennas may be located underneath a DUT on the DIB. For a housing among the separate housings, an antenna among the antennas may be located directly above a socket on the DIB.

The cap may comprise a plunger for each separate housing. The plunger may have multiple holes along at least part of a longitudinal dimension of the plunger. The plunger may have a single hole along at least part of a longitudinal dimension of the plunger. The plunger may be hollow along at least part of a longitudinal dimension of the plunger. Each separate housing may be for housing isolating a DUT enclosed in the housing at least one of physically or electromagnetically from other DUTs in other ones of the housings. The system may be part of a change kit configured to adapt the sockets of the DIB to perform radiated testing on the DUTs.

Any two or more of the features described in this specification, including in this summary section, can be combined to form implementations not specifically described herein.

The systems and techniques described herein, or portions thereof, can be implemented using and/or controlled by a computer program product that includes instructions that are stored on one or more non-transitory machine-readable storage media, and that are executable on one or more processing devices to control (e.g., coordinate) the operations described herein. The systems and techniques described herein, or portions thereof, can be implemented as an apparatus, method, or electronic system that can include one or more processing devices and memory to store executable instructions to implement various operations.

The details of one or more implementations are set forth in the accompanying drawings and the description below. Other features, objects, and advantages will be apparent from the description and drawings, and from the claims.

DESCRIPTION OF THE DRAWINGS

FIG. 1, comprised of FIGS. 1A and 1B, shows a side view and a cut-away perspective view of an example handler change kit.

FIGS. 3A, 3B, and 3C show in perspective, transparent views example plunger configurations for use with an example handler change kit.

Like reference numerals in different figures indicate like elements.

DETAILED DESCRIPTION

Described herein are example implementations of a handler change kit for a test system, such as automatic test equipment (ATE). The handler change kit may be configured for use with a DIB or other appropriate test system hardware. In an example, a DIB may be constructed to support conductive testing of electronic devices, such as computer chips. For example, the DIB may contain multiple sockets, each for holding an electronic device to test. In an example, a socket includes mechanical guidance for a device under test (DUT) and compliant contacts that provide direct electrical connection to contacts on the bottom of the DUT to provide power and control. The DIB may also include interface hardware, vias, and other appropriate circuitry to create an electrical interface between the electronic devices and an underlying test system. Signals may pass between the test system and the electronic devices, enabling the test system to test the electronic devices.

The handler change kit configures the DIB—which may have been constructed to support conductive testing only—also to support radiated testing. For example, all or part the handler change kit may be installed on the DIB, in some implementations over its sockets, to configure the DIB to support radiated testing. Thus, using the handler change kit, legacy DIBs, which may have been constructed to implement conductive testing, can be adapted also to perform radiated testing. The same DIB can be used to perform both conductive and radiated testing. This may save testing time—the DIB need not be switched-out, for example—and cost when perform testing.

In some implementations, the handler change kit is a system that includes a receptacle to house a DUT. For example, as described herein, the receptacle may be placed over a socket on a DIB. A cap is configured to mate to the receptacle to form a housing to enclose the DUT. The housing is for isolating the DUT at least one of physically or electromagnetically. For example, the DUT may be isolated physically, electromagnetically, or both physically and electromagnetically from one or more of the following: other DUTs, dielectric materials, metallic materials, magnetic materials, or stray wireless electromagnetic signals. The housing is also configured to confine, in whole or part, signals, including wireless electromagnetic signals that are used for radiated testing of the DUT. One or more antennas are included proximate to the housing for exchanging such signals with the DUT in order to perform radiated testing of the DUT. For example, the antenna(s) may be inside the housing.

In an example, a test site include a combination of all of the handler change kit hardware on a per-DUT basis, e.g., a test site includes of the housing, the cap, and the plunger. The test site also includes the socket on the DIB under the handler change kit.

Figure 2:
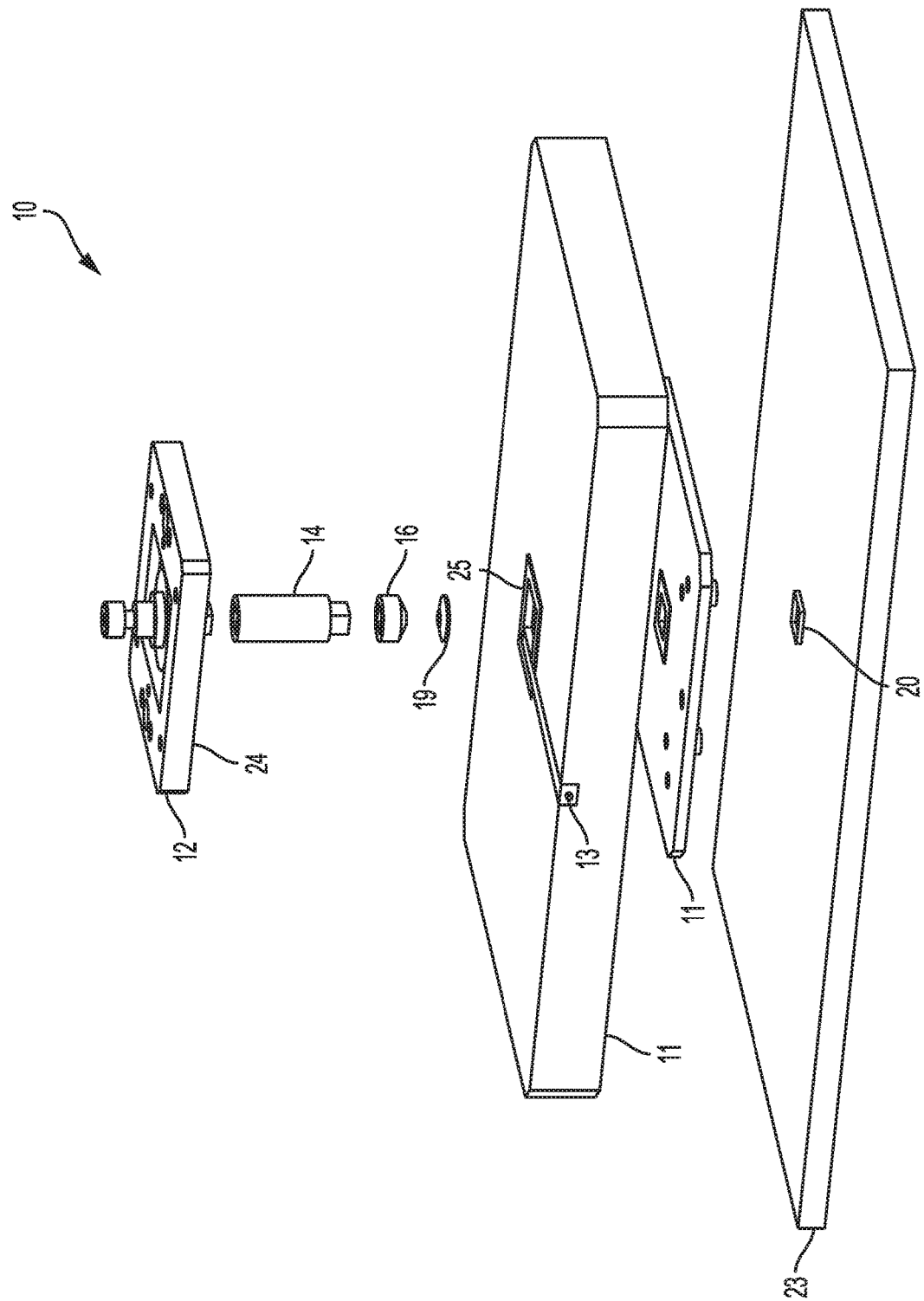
FIG. 2 shows an exploded, perspective view of an example handler change kit.

FIGS. 1 and 2 shows an example implementation of a handler change kit. Not all components are shown in both figures. Components 10 include, but are not limited to, a receptacle 11, a cap 12, a plunger 14 that may be part of the cap, and one or more antennas 13. As explained previously, the receptacle may be mated to a DIB 23 and enclose, in whole or part, a test socket 20 on the DIB that is also configured to perform non-radiated testing of an electronic device. In some implementations, receptacle 11 surrounds the socket, and has an opening only at its top to receive the plunger and cap. Cap 12 is movable relative to receptacle 11. Specifically, cap 12 is movable over, and into contact with, receptacle 11. When in contact, cap 12 mates to receptacle 11 to form a housing that encloses socket 20 and, thus, a DUT in socket 20.

Example cap 12 includes a pick-up element, such as plunger 14. In this example, plunger 14 includes an arm 15 and a suction cup 16; however, the pick-up element may include any appropriate components. In operation, plunger 14 retrieves a DUT 19 and moves that DUT to socket 20 on DIB 23 enclosed by receptacle 11. Any appropriate robot or robotic system—for example, a pick-and-place robot—may be used to hold and to move the cap and plunger combination. For example, a robot may move the cap and plunger combination so that suction cup 16 contacts a device to be tested—the DUT. Vacuum under the suction cup causes the DUT to stick to the suction cup, as shown in FIGS. 1 and 2. Accordingly, when cap and plunger combination is moved, the DUT remains stuck to the suction cup.

The cap and plunger combination are moved into place so that the DUT is over socket 20, and so that cap 12 is over receptacle 11. The cap and plunger combination is moved towards the socket and receptacle until the cap contacts the receptacle and the DUT is in contact with the socket. For example, cap 12 may contact receptacle first to form a housing. In this instance, plunger 14 may be moved downward, within and through cap 12, until the DUT is fixed into position in the socket. In some implementations, the DUT is held in the socket tightly enough to allow the plunger to disengage from the DUT without the DUT disengaging from the socket. In some implementations, the plunger remains in contact with the DUT during testing, and is configured to disengage the DUT from the socket following testing in order to remove the DUT from the socket.

In some implementations, the DUT is connected electrically to electrical contacts in socket 20. Conductive testing may be performed via those connections. Thus, the DUT may be subject to both conductive and radiated testing contemporaneously. In some implementations, the DIB is a legacy DIB that is also configurable for use absent the housing and outside a context of radiated testing. As noted, the DIB may be used to perform conductive testing on the DUT and may be configured, using the handler change kit described herein also to perform radiated testing on the DUT.

The housing defines a volume that surrounds the DUT, at least partly. That is, in some implementations, the housing does not contact the DUT, but rather defines a chamber 25 that encloses the DUT. The chamber confines wireless electromagnetic signals, in whole or part, within its interior. These signals are used to perform radiated testing on the DUT, as described herein. In some implementations, the chamber is anechoic, at least in part. For example, the interior walls of the chamber—for example, the interior of the housing, including the underside 24 of cap 12—may be lined with one or more appropriate materials to suppress, e.g., to eliminate, or to reduce, echoes of wireless electromagnetic signals within the chamber. Any appropriate material may be used to suppress the echoes. Examples of such material include, but are not limited to, carbon-loaded air-based foam, carbon-loaded rubber, and magnetically-loaded material. In some implementations, the housing may be sealed to reduce signal loss or to reduce signal interference within the chamber. In some implementations, the housing may be shielded from electromagnetic (EM) interference. In some implementations, the housing prevents EM signals from entering the housing or EM signals from leaving the housing. In some implementations, the housing may also be air-tight. As a result, the housing may isolate a corresponding DUT physically, electromagnetically, or both physically and electromagnetically.

In some implementations, the housing—which is comprised of at least the receptacle and the cap in some implementations—may be made of metal; however, the system is not limited to use with metal housings. Any appropriate type of metal or other material may be used. In some implementations, plunger 14, in whole or in part, is made of a non-conductive material. In some implementations, at least the part of plunger 14 that extends into chamber 25 is made of a non-conductive material so as to reduce interference with signals in the chamber. In some implementations, the plunger is comprised of a material having one or more of electrical properties in appropriate ranges to reduce signal interference. Such electrical properties include, but are not limited to, dielectric permittivity, permeability, conductivity, or some combination of dielectric permittivity, permeability, and/or conductivity. In some implementations, the plunger may be made of, or include at least in part, polyether ether ketone (PEEK). However, the plunger is not limited to a composition comprising PEEK; any appropriate material or materials may be used to implement the plunger.

In some implementations, the amount of material in the plunger may be reduced, thereby reducing the amount of material, other than air, in the chamber. This reduction in material may promote signal integrity within the chamber by reducing signal interference. Examples of different plunger configurations are shown in FIGS. 3A, 3B, and 3C. The system, however, is not limited to use with plungers having these configurations; any appropriate plunger configuration may be used. In each of FIGS. 3A, 3B, and 3C, cap 12 includes a plunger to contact the DUT as described herein. The plunger is capable of moving through, and relative to, cap 12 in order to apply pressure to the DUT or to disengage the DUT from a socket while, for example, the cap remains in contact with receptacle 11 to form the housing. In the example of FIG. 3A, plunger 14A has multiple holes along all or part of a longitudinal dimension of the plunger. In this case, the longitudinal dimension is represented by arrow 26. In the example of FIG. 3B, plunger 14B has a single hole along all or part of the longitudinal dimension of the plunger. In the example of FIG. 3C, plunger 14C is hollow along all or part of the longitudinal dimension of the plunger. In FIG. 3C, the structural part of the plunger may be sufficiently thick to support pressure needed to hold the DUT, to force the DUT into contact at a socket, and to remove the DUT from the socket. In some implementations, the top of the plunger is covered so that a hole does not expose the interior of the housing—chamber 25—to the external environment, although this is not a requirement.

The handler change kit may configure the DIB to test the DUT in a contacts-down configuration or in a contacts-up configuration. In this regard, an example DUT has electrical contacts on one surface for making an electrical connection to corresponding electrical contacts on a DIB or other device. An opposite surface of the DUT typically includes packaging, and does not contain electrical contacts. In some implementations, the plunger may contact the surface containing the packaging such that the contacts are downward-facing, or facing away from the suction cup, and able to engage with corresponding electrical contacts on a socket of the DIB. In some implementations, the plunger may contact the surface containing the contacts such that the contacts are upward-facing, or facing towards the suction cup. In this case, the plunger—for example, the suction cup of the plunger—may contact a part of the DUT that does not contain the contacts. Because the contacts are upward-facing, when the DUT is positioned into the socket, connection may be implemented using a POP-style socket that provides contacts to the socket side of the DUT. With these types of sockets, a bottom socket touches the DIB, a top socket has connections that are made through the bottom socket to the DIB and create connections on the side of the DUT away from the DIB when the cap is closed. In some implementations, this type of socket takes the connections from the DIB and passes the connections through to the cap and then to the DUT.

Wireless electromagnetic signals are introduced into chamber 25 via one or more test antennas that may be located at appropriate positions inside of, or outside of, the chamber. Wireless electromagnetic signals emanating from these test antennas may be used to test antennas on the DUT or any other appropriate circuitry on the DUT. For example, signals sent from one or more test antennas may be received by one or more DUT antennas. Responses to those signals may then be sent from the DUT either via its antennas or via electrical contacts on the test socket. In any case, those responses may be analyzed by the test system or test instrument to determine whether the DUT antennas are working properly, the DUT is working properly, some parameter of the DUT is within an acceptable range, and so forth. The test antennas may be part of the handler change kit and may be incorporated at various locations over, on, in, or under the DUT or DIB. Any appropriate number of test antennas may be used.

Figure 4:
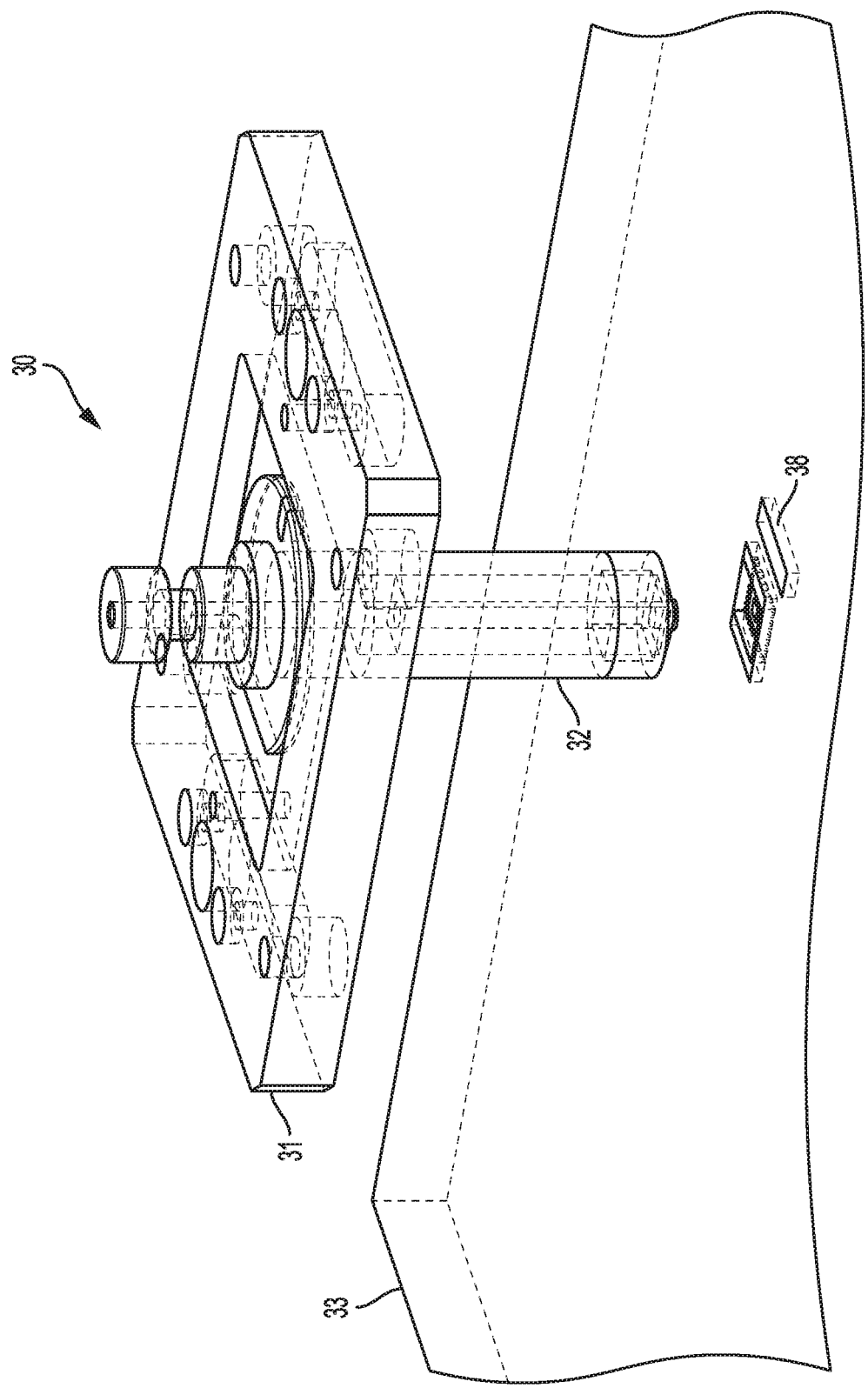
FIGS. 4, 5, 6, 7, and 8 show, in perspective, transparent views, components of an example handler change kit having different antenna configurations.
Figure 5:
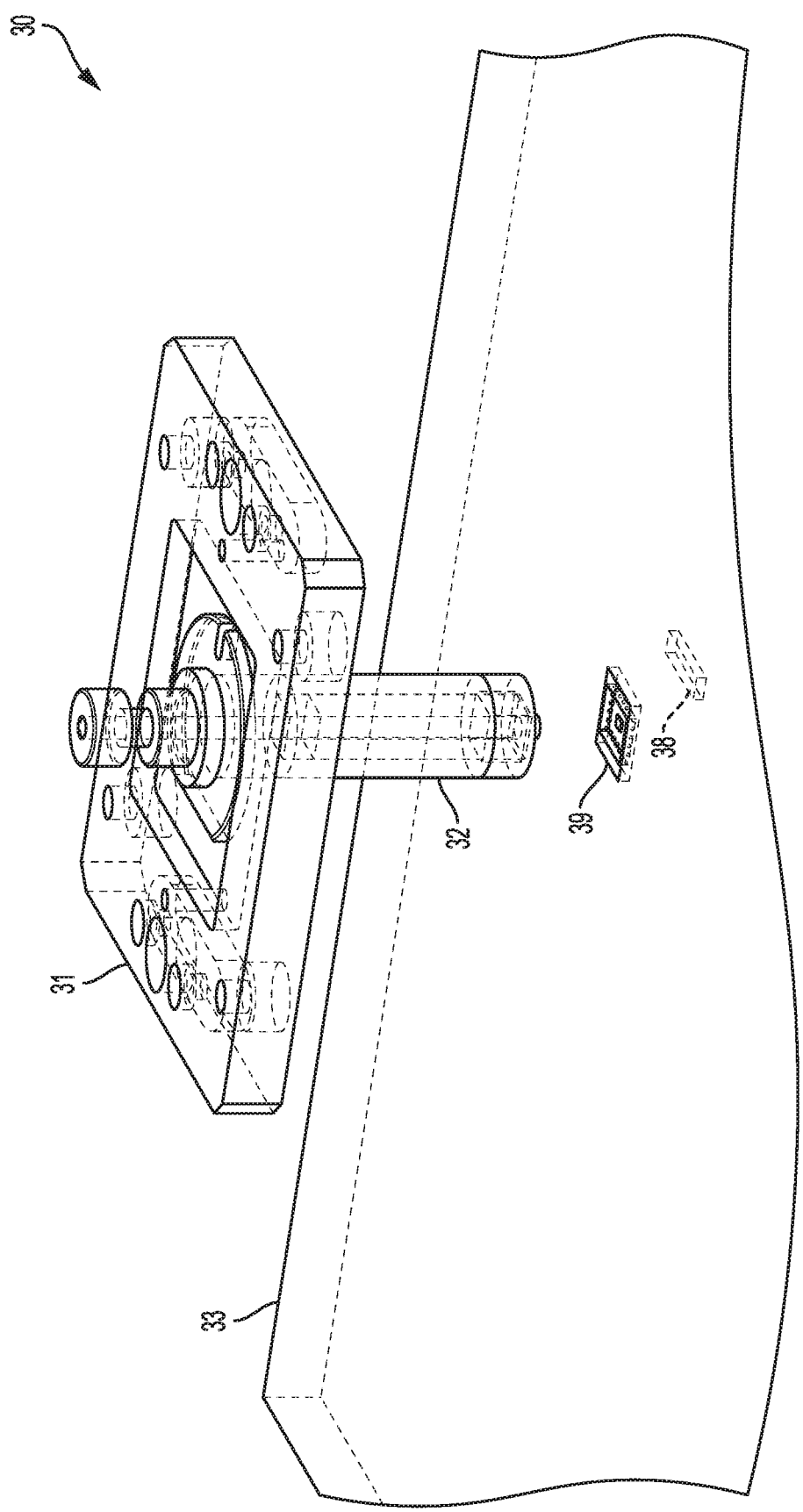
Figure 6:
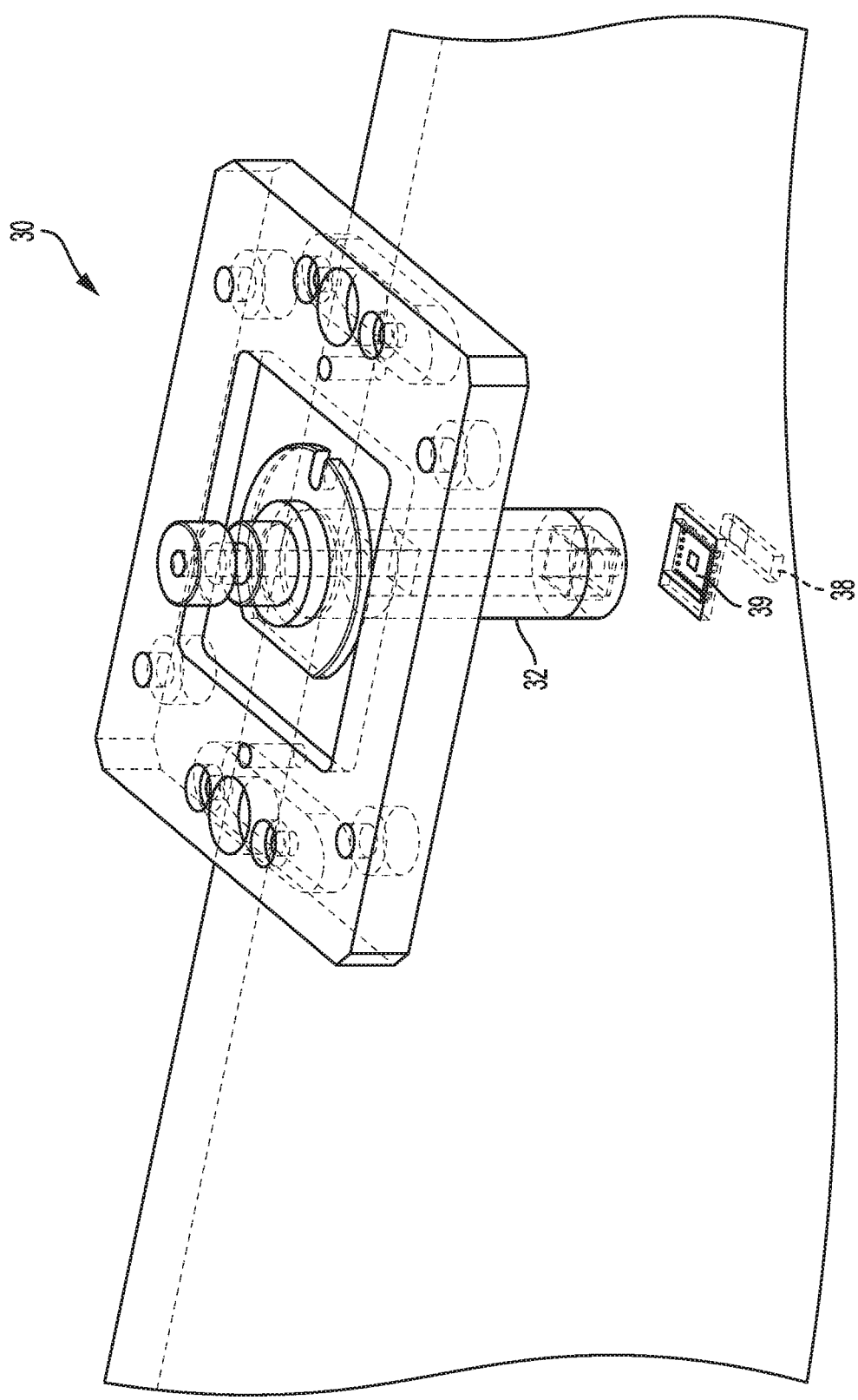
Figure 7:
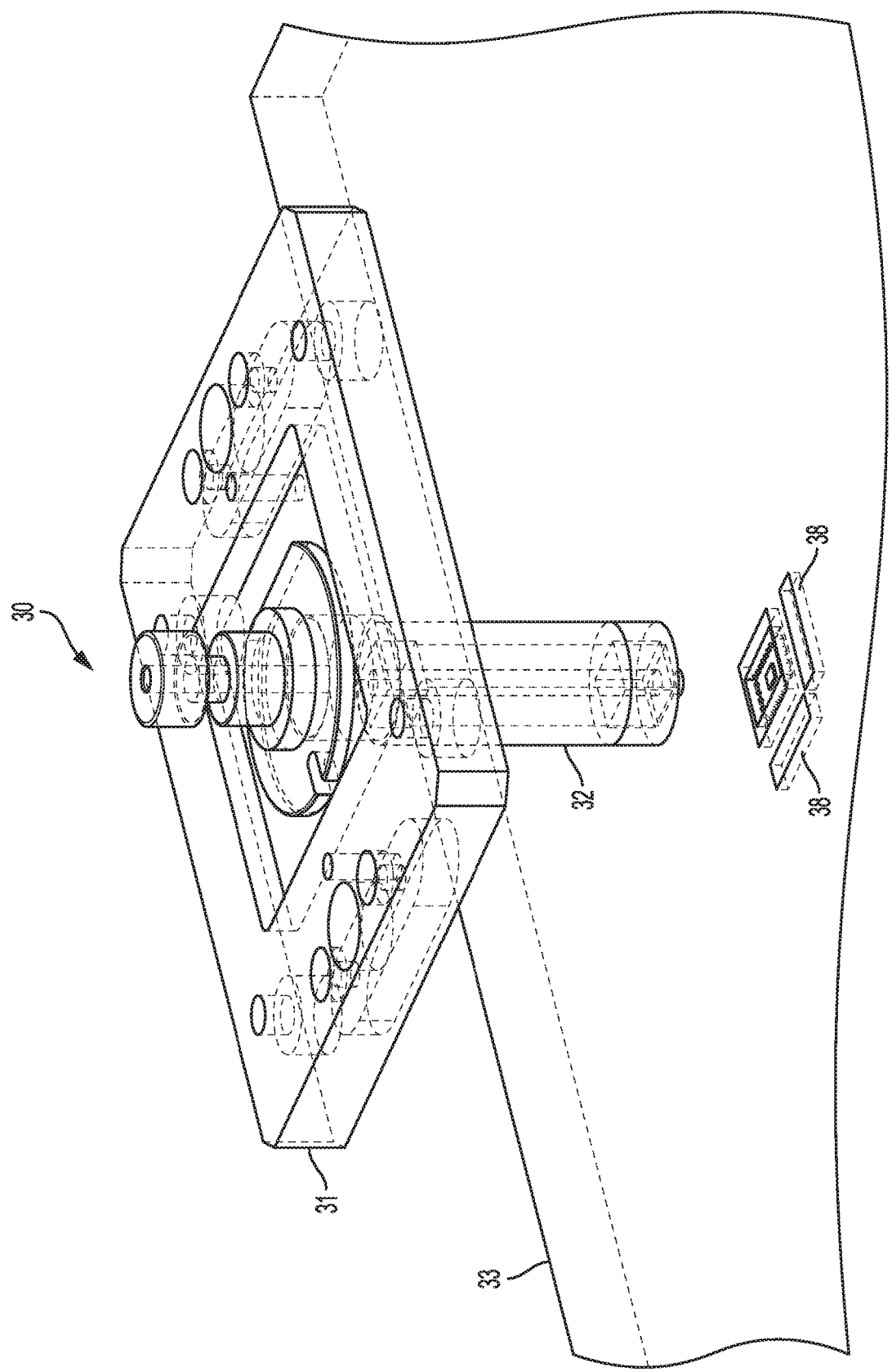
Figure 8:
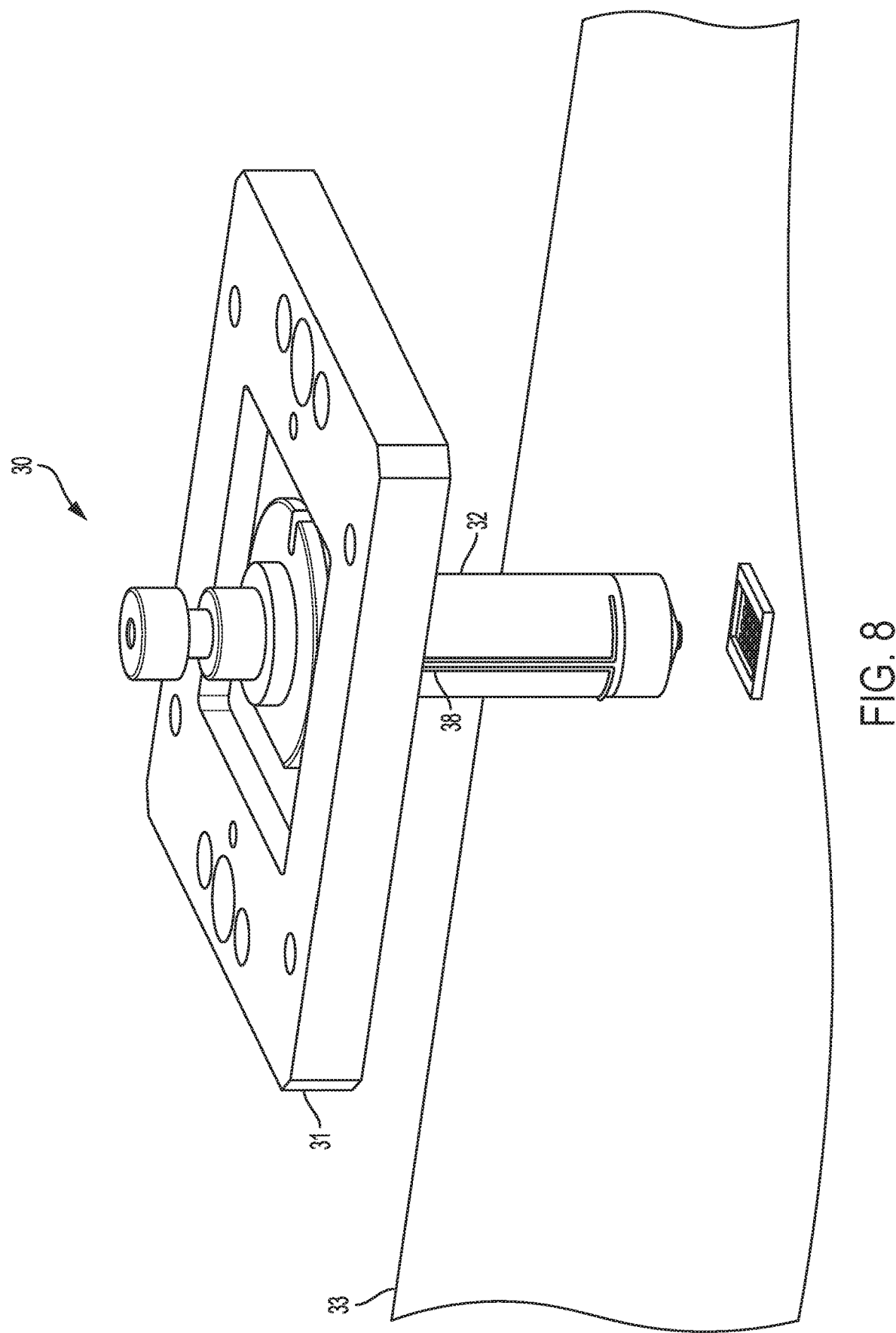

FIGS. 4, 5, 6, 7, and 8 show examples of components of a handler change kit 30, which may be of the type shown in FIGS. 1 and 2. Handler change kit 30 includes cap 31 and plunger 32 over DIB 33. Portions of the receptacle are omitted in these figures. Each of the antennas may make a wired or wireless connection to the test instrument. Referring to FIG. 4, in some implementations, one or more test antennas 38 may be located within the DIB. Referring to FIG. 5, in some implementations, one or more test antennas 38 may be located underneath the DIB. In this example, the antennas are located in the test instrument; however, that is not a requirement. Referring to FIG. 6, in some implementations, one or more test antennas 38 may be located underneath the DUT (shown in FIG. 6 under socket 39 configured to receive, and to hold, the DUT). For example, the DUT may mate to socket 39 on the DIB, and a test antenna may be located at any appropriate position underneath the DUT. Referring to FIG. 7, in some implementations, one or more test antennas 38 may be located on either side of the DUT or the plunger. For example, as shown in FIG. 7, a handler change kit may include two test antennas. One of the two test antennas may be located on one side of the DUT/test socket and the other of the two test antennas may be located on another side—for example, the opposite or adjacent side—of the DUT/test socket. Referring to FIG. 8, in some implementations, one or more test antennas 38 may be located within the plunger. For example, test antennas within the plunger may be configured to withstand, and to operate with, movement of the plunger attendant to its use. In some implementations, each antenna is low-gain antenna positioned close to the DUT to reduce chamber size. The hander change kit is not limited to the antenna positions or to the number of antennas mentioned; any appropriate position or number may be used.

Although a single handler change kit has been described for a DIB test socket, a DIB may include one or more other sockets to receive one or more other DUTs. Each DIB test socket may accommodate, as appropriate, a separate handler change kit of the type described herein. Each handler change kit may isolate a corresponding DUT physically, electromagnetically, or both physically and electromagnetically as described herein.

In some implementations, a single chamber, such as chamber 25 of FIG. 2, may enclose two or more test sockets. In these examples, multiple plungers may be employed in a cap or caps to install DUTs into the sockets. The isolation in these example systems is not physical, but rather electromagnetic. For example, signals may be exchanged with one DUT in a first frequency band, and signals may be exchanged with at least one other DUT in at least one second frequency band that is different from the first frequency band. Accordingly, DUTs in the single chamber are isolated electromagnetically from each other through the use of signals in different frequency bands. That is, one DUT may recognize only signals in one frequency band, and another DUT may recognize signals only in a different frequency band. As such, electromagnetic testing may be performed on different DUTs within the same chamber.

Figure 9:
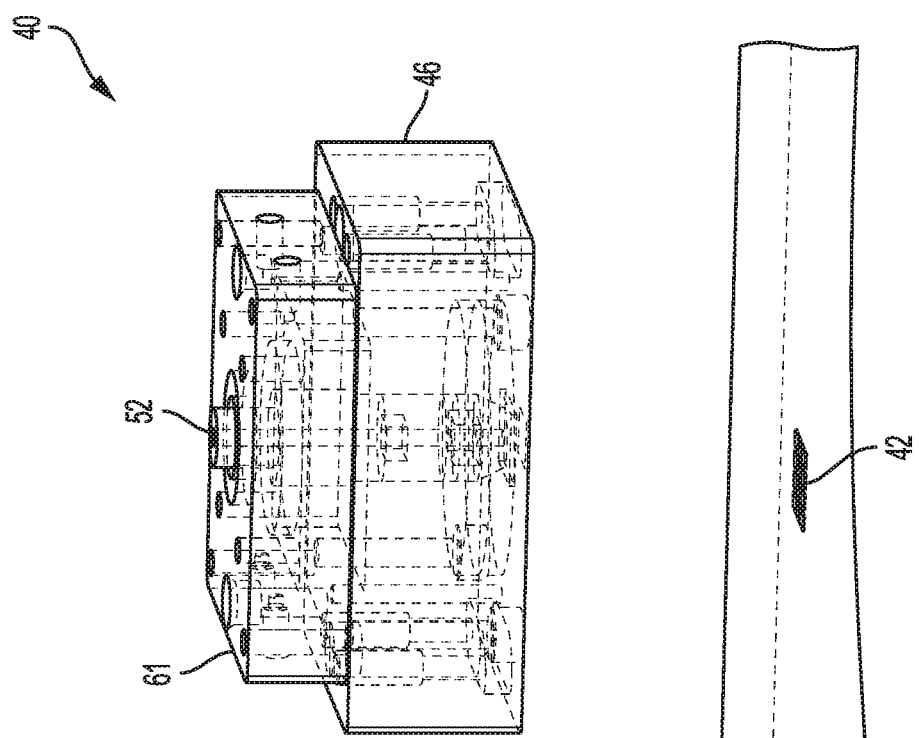
FIG. 9 shows, in perspective, transparent view, components of an example handler change kit containing multiple housings.
Figure 9:
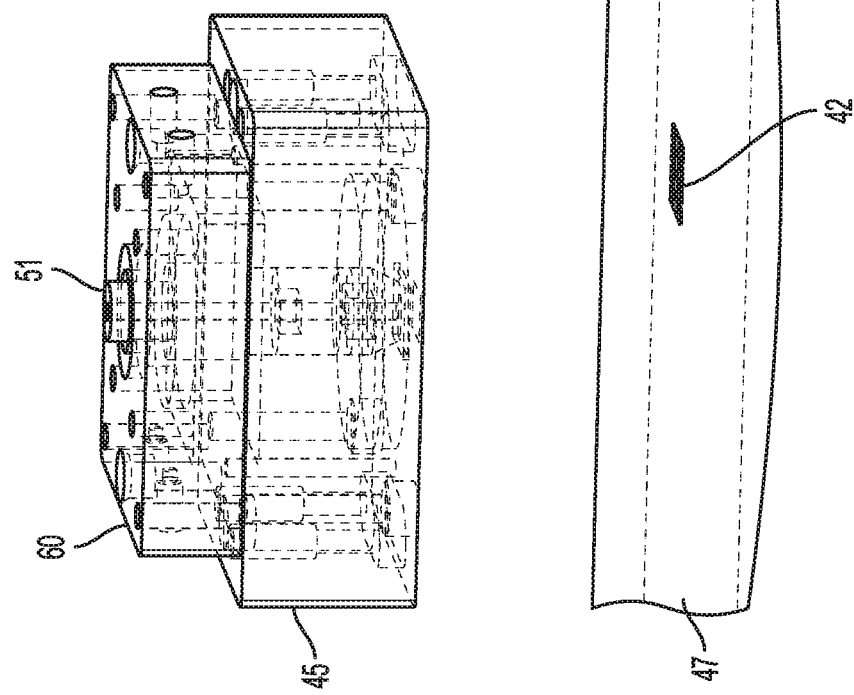

In some implementations, the handler change kit is part of a system that includes a DIB for interfacing to a test system, such as ATE. The DIB includes multiple sockets, each of the sockets for receiving a DUT. The system includes multiple receptacles, each of which is for a different one of the sockets. The system includes antennas. Each of the antennas is associated with a different one of the sockets and each socket may include more than one antenna. Each antenna is for exchanging signals with a DUT in a socket. At least some of the signals are for use in performing radiated—that is, non-conductive—testing of a DUT in a socket as described herein. One or more caps—for example, a single cap—are configured to mate to the receptacles to form a separate housing for, and enclosing, each one of the DUTs. A cap may include one or more plungers, such as one plunger for each receptacle. The multiple plungers may be actuated using different actuation mechanisms or using a single actuation mechanism. Each separate housing isolates a DUT enclosed in the housing at least one of physically or electromagnetically, as described herein. FIG. 9 shows an example handler change kit 40 of the type described above. The handler change kit may include any appropriate features described herein, including those described with respect to FIGS. 1 to 8.

In the example of FIG. 9, handler change kit 40 includes receptacle 45 and 46 that encloses, separately and respectively, multiple test sockets 42 and 43 of DIB 47. The receptacles may be a single contiguous structure or multiple separate receptacles as shown. Although two test sockets are shown, any appropriate number of test sockets may be enclosed. Handler change kit 40 includes caps 60 and 61, which when mated to receptacles 45 and 46, respective, form—in this example—two separate housings that can physically and electromagnetically isolate DUTs contained therein. Each housing may have, as appropriate, any features of the housing described herein, such as the housing comprised of receptacle 11 and cap 12. In this example, cap 60 includes plunger 51 and cap 61 includes plunger 52, each for holding a DUT and for placing a DUT in a corresponding test socket on the DIB as described herein. Each plunger may have the same or a different configuration. Example configurations for the plungers include, but are not limited to, those shown in FIGS. 3A, 3B, and 3C.

Placement of a DUT in a DIB socket may be contacts-down or contacts-up, as described. The plungers may be actuated separately or in synchronism, as appropriate. Each housing formed by the contact between the cap and the may include one or more antennas, as described herein. Each housing may have antennas placed in the same configuration or in different configurations. Example antenna configurations include, but are not limited to, those shown in FIGS. 4, 5, 6, 7, and 8. For example, in each housing, each antenna may be located to a side of a socket on the DIB, or antennas may be located underneath a DUT, underneath the DIB, above the DUT, above the DIB, inside a DIB, or at any other appropriate location inside of or outside of the housing. Each plunger may have multiple holes, a single hole, or be hollow along at least part of a longitudinal dimension of the plunger, as described herein. Each housing is for isolating a DUT enclosed in the housing at least one of physically or electromagnetically from other DUTs in other ones of the housings.

The example test systems described herein may be implemented using, and/or controlled by, one or more computer systems comprising hardware or a combination of hardware and software. For example, a system to test a DUT may include various controllers and/or processing devices located at various points in the system to control operation of the automated elements. A central computer may coordinate operation among the various controllers or processing devices. The central computer, controllers, and processing devices may execute various software routines to effect control and coordination of the various automated elements.

The example systems described herein can be controlled, at least in part, using one or more computer program products, e.g., one or more computer program tangibly embodied in one or more information carriers, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one socket or distributed across multiple sockets and interconnected by a network.

Actions associated with implementing all or part of the testing can be performed by one or more programmable processors executing one or more computer programs to perform the functions described herein. All or part of the testing can be implemented using special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Any "electrical connection" as used herein may imply a direct physical connection or a wired or wireless connection that includes or does not include intervening components but that nevertheless allows electrical signals to flow between connected components. Any "connection" involving electrical circuitry that allows signals to flow, unless stated otherwise, is an electrical connection and not necessarily a direct physical connection regardless of whether the word "electrical" is used to modify "connection".

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. A system comprising:
   a receptacle to house a device under test (DUT), the receptacle comprising walls that are configured for placement over and to surround a socket that holds the DUT, the socket being part of a device interface board (DIB) of a test system that is separate from the receptacle;
   an antenna in the receptacle for exchanging signals with the DUT, at least some of the signals for use in performing radiated testing of the DUT; and
   a cap configured to mate to the receptacle to form a housing to enclose the DUT, the housing, including the receptacle, being separate from the socket and being for isolating the DUT at least one of physically or electromagnetically;
   wherein the DIB is originally configured to support conductive testing of the DUT but not radiated testing, and wherein the system is installable on the DIB to reconfigure the DIB to support contemporaneous radiated testing of the DUT.

2. The system of claim 1, wherein the system is configured to connect to the DIB, the DIB comprising one or more other sockets to receive one or more other DUTs, the housing for isolating the DUT from the one or more other DUTs.

3. The system of claim 2, wherein the DIB comprises a legacy DIB that is also configurable for use absent the housing and outside a context of radiated testing.

4. The system of claim 1, wherein the housing is for isolating the DUT both physically and electromagnetically from one or more of the following: other DUTs, dielectric materials, metallic materials, or magnetic materials.

5. The system of claim 1, wherein the cap comprises a plunger that is movable within the receptacle to apply pressure to the DUT to cause the DUT to connect to the socket.

6. The system of claim 1, wherein an antenna is arranged to a side of the socket.

7. The system of claim 1, wherein each of multiple antennas are arranged on a side of the socket.

8. The system of claim 1, wherein an antenna arranged is underneath at least one of the DUT or the DIB.

9. The system of claim 8, wherein an antenna is underneath the DUT.

10. The system of claim 8, wherein an antenna is underneath the DIB.

11. The system of claim 8, wherein an antenna is part of the DIB.

12. The system of claim 8, wherein the DUT has a surface comprising electrical connections, the cap comprising a plunger configured to hold the DUT by the surface containing the electrical connections and to mount the DUT such that the electrical connections face away from the socket; and
   wherein the system comprises one or more electrical conduits to connect to the electrical connections.

13. The system of claim 1, wherein the cap comprises a plunger to contact the DUT; and
   further comprising an antenna within the plunger.

14. The system of claim 13, wherein the plunger is directly above the socket, and is configured to move within the receptacle relative to the socket.

15. The system of claim 1, wherein the cap comprises a plunger to contact the DUT; and
wherein the plunger is comprised of a material having one or more of electrical properties.

16. The system of claim 15, wherein the one or more electrical properties comprise ranges of dielectric permittivity, permeability, or conductivity.

17. The system of claim 15, wherein the material comprises, at least in part, polyether ether ketone (PEEK).

18. The system of claim 1, wherein the cap comprises a plunger to contact the DUT; and
wherein the plunger has multiple holes along at least part of a longitudinal dimension of the plunger.

19. The system of claim 1, wherein the cap comprises a plunger to contact the DUT; and
wherein the plunger has a single hole along at least part of a longitudinal dimension of the plunger.

20. The system of claim 1, wherein the cap comprises a plunger to contact the DUT; and
wherein the plunger is hollow along at least part of a longitudinal dimension of the plunger.

21. The system of claim 1, wherein an interior of the housing is lined, at least in part, with a material for suppressing echoes.

22. The system of claim 20, wherein the plunger comprises a vacuum channel for holding the DUT via suction during transport to the receptacle.

23. The system of claim 1, wherein the housing is configured to house the DUT and at least one other DUT, the DUT being isolated electromagnetically from the at least one other DUT through signals having different frequency bands.

24. The system of claim 23, wherein signals exchanged with the DUT are in a first frequency band, signals exchanged with the at least one other DUT are in at least one second frequency band, and the first frequency band is different from the at least one second frequency band.

25. The system of claim 1, wherein the system is part of a change kit configured to connect to the DIB, the DIB comprising test sockets configured for performing non-radiated testing, the change kit for adapting at least one of the test sockets to perform radiated testing on the DUT.

26. A system comprising:
a device interface board (DIB) for interfacing to a test system, the DIB comprising sockets, each of the sockets for receiving a device under test (DUT), where the DIB is configured to enable conductive testing of each DUT and radiated testing of each DUT;
receptacles, each of the receptacles being for a different one of the sockets, each receptacle comprising walls that are configured for placement over and to surround a different one of the sockets, each receptacle being separate from the different one of the sockets;
antennas, ones of the antennas being within respective receptacles and each one being associated with a different one of the sockets, each antenna for exchanging signals with a DUT in a socket, at least some of the signals for use in performing radiated testing of the DUT in the socket; and
a cap configured to mate to the receptacles to form a separate housing for, and enclosing, each one of the DUTs, each separate housing isolating a DUT enclosed in the housing at least one of physically or electromagnetically;
wherein the DIB is originally configured to support conductive testing of the DUT but not radiated testing, and wherein the receptacles, antennas, and cap are installable on the DIB to reconfigure the DIB also to support contemporaneous radiated testing of the DUT.

27. The system of claim 26, wherein the cap comprises one or more plungers, each of the one or more plungers for holding, and contacting, a DUT in a separate socket.

28. The system of claim 26, wherein, for a housing among the separate housings, an antenna is located to a side of a socket on the DIB.

29. The system of claim 26, wherein, for a housing among the separate housings, an antenna is located underneath a DUT on the DIB.

30. The system of claim 26, wherein, for a housing among the separate housings, an antenna is located directly above a socket on the DIB.

31. The system of claim 26, wherein the cap comprises a plunger for each separate housing, the plunger having multiple holes along at least part of a longitudinal dimension of the plunger.

32. The system of claim 26, wherein the cap comprises a plunger for each separate housing, the plunger having a single hole along at least part of a longitudinal dimension of the plunger.

33. The system of claim 26, wherein the cap comprises a plunger for each separate housing, the plunger being hollow along at least part of a longitudinal dimension of the plunger.

34. The system of claim 26, wherein each separate housing is for isolating a DUT enclosed in the housing at least one of physically or electromagnetically from other DUTs in other ones of the housings.

35. The system of claim 26, wherein the system is part of a change kit configured to adapt the sockets of the DIB to perform radiated testing on the DUTs.

* * * * *